United States Patent
Zou

(10) Patent No.: US 10,607,535 B2
(45) Date of Patent: Mar. 31, 2020

(54) LIGHTING PANEL, DRIVING METHOD OF THE SAME, AND LIGHTING LAMP

(71) Applicant: BOE TECHNOLOGY GROUP CO., LTD., Beijing (CN)

(72) Inventor: Xiangxiang Zou, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/222,132

(22) Filed: Dec. 17, 2018

(65) Prior Publication Data

US 2019/0206314 A1  Jul. 4, 2019

(30) Foreign Application Priority Data

Jan. 4, 2018 (CN) .......................... 2018 1 0007153

(51) Int. Cl.
*G09G 3/3225* (2016.01)
*G06F 3/041* (2006.01)
(Continued)

(52) U.S. Cl.
CPC ........... *G09G 3/3225* (2013.01); *G06F 3/017* (2013.01); *G06F 3/041* (2013.01); *G06F 3/0412* (2013.01);
(Continued)

(58) Field of Classification Search
CPC .. G09G 3/3225; G09G 3/3266; G09G 3/3275; H01L 27/3211; H01L 51/5203;
(Continued)

(56) References Cited

U.S. PATENT DOCUMENTS 10,031,629 B2   7/2018 Wu
2014/0043247 A1* 2/2014 Singh ................... G06F 1/3218
                                                   345/173
(Continued)

FOREIGN PATENT DOCUMENTS

CN    104712922 A    6/2015
CN    105243993 A    1/2016
(Continued)

OTHER PUBLICATIONS

First Office Action dated Jul. 30, 2019 corresponding to Chinese Application No. 201810007153.7; English Translation Attached.

*Primary Examiner* — Premal R Patel
(74) *Attorney, Agent, or Firm* — Nath, Goldberg & Meyer; Joshua B. Goldberg

(57) ABSTRACT

The lighting panel includes a plurality of light-emitting devices, each light-emitting device includes a first electrode, a second electrode, and a light-emitting layer disposed therebetween, the first electrodes of at least a part of the plurality of light-emitting devices are divided into a first and second group of first electrodes; touch scan lines and touch sensing lines, the touch scan lines are electrically coupled to the first group of first electrodes which are configured to receive a first lighting signal during a lighting period and receive a touch driving signal during a touch period, and the touch sensing lines are electrically coupled to the second group of first electrodes which are configured to receive a second lighting signal during the lighting period and transmit touch sensing signals during the touch period; and a controller configured to control lighting parameters of the lighting panel according to the touch sensing signals.

20 Claims, 8 Drawing Sheets

(51) Int. Cl.
  *H01L 27/32* (2006.01)
  *G09G 3/3275* (2016.01)
  *G09G 3/3266* (2016.01)
  *G06F 3/044* (2006.01)
  *G06F 3/01* (2006.01)
  *H01L 51/52* (2006.01)
(52) U.S. Cl.
  CPC .......... *G06F 3/0443* (2019.05); *G06F 3/0446* (2019.05); *G06F 3/04164* (2019.05); *G06F 3/04166* (2019.05); *G09G 3/3266* (2013.01); *G09G 3/3275* (2013.01); *H01L 27/322* (2013.01); *H01L 27/3202* (2013.01); *H01L 27/323* (2013.01); *H01L 27/3211* (2013.01); *H01L 51/5203* (2013.01); *G06F 2203/04101* (2013.01); *G06F 2203/04103* (2013.01); *H01L 2251/5361* (2013.01); *Y02B 20/343* (2013.01)
(58) Field of Classification Search
  CPC . H01L 27/322; H01L 27/323; H01L 27/3202; H01L 2251/5361; G06F 3/0446; G06F 3/04166; G06F 3/04164; G06F 3/017; G06F 3/0443; G06F 3/0412; G06F 3/041; G06F 2203/04101; G06F 2203/04103; Y02B 20/343; F21Y 2115/15; H05B 33/0896; F21V 23/0485; F21V 23/003; F21V 19/0025; F21K 9/64; F21K 9/20
  See application file for complete search history.

(56) References Cited

U.S. PATENT DOCUMENTS

| | | | | |
|---|---|---|---|---|
| 2014/0071360 | A1* | 3/2014 | Chang | G06F 3/0412 349/12 |
| 2014/0168154 | A1* | 6/2014 | Wang | G06F 3/0412 345/174 |
| 2015/0177880 | A1* | 6/2015 | Shin | G06F 3/0412 345/174 |
| 2016/0054907 | A1* | 2/2016 | Luo | G06F 3/04847 345/173 |
| 2016/0147348 | A1* | 5/2016 | Liu | G06F 3/0412 345/173 |
| 2016/0306466 | A1* | 10/2016 | Gotoh | G06F 3/044 |
| 2018/0261653 | A1 | 9/2018 | Ye | |

FOREIGN PATENT DOCUMENTS

| | | |
|---|---|---|
| CN | 105552106 A | 5/2016 |
| CN | 106802742 A | 6/2017 |

\* cited by examiner

```
┌─────────────────────────────────────────────────────────────┐
│ DEPOSIT A METAL MATERIAL ON THE SUBSTRATE, AND THEN FORM,   │
│ BY PERFORMING A PATTERNING PROCESS ON THE DEPOSITED         │
│ METAL MATERIAL, A PATTERN INCLUDING ONE OF                  │
│ THE TOUCH SCAN LINE AND THE TOUCH SENSING LINE              │
└─────────────────────────────────────────────────────────────┘
                              ↓
┌─────────────────────────────────────────────────────────────┐
│ FORM, BY A PATTERNING PROCESS, A PATTERN INCLUDING          │
│ THE PASSIVATION LAYER ON THE ONE OF THE TOUCH SCAN          │
│ LINE AND THE TOUCH SENSING LINE                             │
└─────────────────────────────────────────────────────────────┘
                              ↓
┌─────────────────────────────────────────────────────────────┐
│ DEPOSIT A CONDUCTIVE MATERIAL ON THE PASSIVATION LAYER,     │
│ AND THEN FORM, BY PERFORMING A PATTERNING PROCESS ON        │
│ THE DEPOSITED CONDUCTIVE MATERIAL, A PATTERN INCLUDING      │
│ THE FIRST ELECTRODE                                         │
└─────────────────────────────────────────────────────────────┘
                              ↓
┌─────────────────────────────────────────────────────────────┐
│ DEPOSIT A METAL MATERIAL ON THE FIRST ELECTRODE, AND        │
│ THEN FORM, BY PERFORMING A PATTERNING PROCESS ON            │
│ THE DEPOSITED METAL MATERIAL, A PATTERN INCLUDING THE       │
│ OTHER ONE OF THE TOUCH SCAN LINE AND THE TOUCH SENSING LINE │
└─────────────────────────────────────────────────────────────┘
                              ↓
┌─────────────────────────────────────────────────────────────┐
│ FORM, BY A PATTERNING PROCESS, A PATTERN INCLUDING THE      │
│ DEFINITION LAYER ON THE OTHER ONE OF THE TOUCH SCAN LINE    │
│ AND THE TOUCH SENSING LINE                                  │
└─────────────────────────────────────────────────────────────┘
                              ↓
┌─────────────────────────────────────────────────────────────┐
│ DEPOSIT A LUMINESCENT MATERIAL, AND THEN FORM, BY PERFORMING│
│ A PATTERNING PROCESS ON THE DEPOSITED LUMINESCENT MATERIAL, │
│ A PATTERN INCLUDING THE LIGHT-EMITTING LAYER                │
└─────────────────────────────────────────────────────────────┘
                              ↓
┌─────────────────────────────────────────────────────────────┐
│ DEPOSIT A METAL MATERIAL, AND THEN FORM, BY PERFORMING      │
│ A PATTERNING PROCESS ON THE DEPOSITED METAL MATERIAL,       │
│ A PATTERN INCLUDING THE SECOND ELECTRODE                    │
└─────────────────────────────────────────────────────────────┘
                              ↓
┌─────────────────────────────────────────────────────────────┐
│ PERFORM A PACKAGING PROCESS AND FORM                        │
│ THE OLED INCLUDING THE PROTECTION LAYER                     │
└─────────────────────────────────────────────────────────────┘
```

FIG. 4

LIGHTING PANEL, DRIVING METHOD OF THE SAME, AND LIGHTING LAMP

CROSS-REFERENCE TO RELATED APPLICATION

The present application claims the priority of the Chinese Patent Application No. 201810007153.7 filed on Jan. 4, 2018, the contents of which are incorporated herein by reference.

TECHNICAL FIELD

The present disclosure relates to the field of lighting technology, and particularly relates to a lighting panel, a driving method of the same, and a lighting lamp.

BACKGROUND

With the development of the society, people's standard of living is continuously improving. However, there is a trend that ages of myopia patients have become lower and lower, which causes more attention to eye health of children and teenagers.

SUMMARY

The present disclosure provides a lighting panel, including a plurality of light-emitting devices, each light-emitting device includes a first electrode, a second electrode, and a light-emitting layer disposed therebetween, the first electrodes of at least a part of the plurality of light-emitting devices being divided into a first group of first electrodes and a second group of first electrodes, the plurality of light-emitting devices being arranged in rows and columns along a first direction and a second direction which intersect with each other; at least one touch scan line extending along the first direction and at least one touch sensing line extending along the second direction, the at least one touch scan line being electrically coupled to the first group of first electrodes which are configured to receive at least one first lighting signal during a lighting period and receive at least one touch driving signal during a touch period, respectively, and the at least one touch sensing line being electrically coupled to the second group of first electrodes which are configured to receive at least one second lighting signal during the lighting period and transmit at least one touch sensing signal during the touch period, respectively; and a controller configured to control lighting parameters of the lighting panel according to the at least one touch sensing signal.

In some embodiments, the controller is configured to provide the at least one touch driving signal to the at least one touch scan line during the touch period, acquire the at least one touch sensing signal from the at least one touch sensing line during the touch period, detect at least one touch position and a touch action according to the acquired at least one touch sensing signal, determine a touch behavior according to the detected at least one touch position and touch action, and adjust the at least one first and second lighting signals according to the determined touch behavior during the lighting period, so as to control at least one of brightness and color temperature of the lighting panel.

In some embodiments, the at least one touch scan line and the at least one touch sensing line are arranged to vertically intersect with each other, and are disposed in different layers.

In some embodiments, the lighting panel includes a plurality of touch scan lines, which are arranged parallel with each other and each of the plurality of touch scan lines is electrically coupled to at least one column of the first group of first electrodes; and the lighting panel includes a plurality of touch sensing lines, which are arranged parallel with each other and each of the plurality of touch sensing lines is electrically coupled to at least one row of the second group of first electrodes.

In some embodiments, the lighting panel includes a plurality of touch scan lines, which are arranged parallel with each other and each of the plurality of touch scan lines is electrically coupled to at least one row of the first group of first electrodes; and the lighting panel includes a plurality of touch sensing lines, which are arranged parallel with each other and each of the plurality of touch sensing lines is electrically coupled to at least one column of the second group of first electrodes.

In some embodiments, every L adjacent light-emitting devices in a same row of light-emitting devices are set as a light-emitting unit, the light-emitting devices in a same column are set to be of a same type, the light-emitting devices in at least one column of every L adjacent columns of light-emitting devices are electrically coupled to each other, and L is a natural number.

In some embodiments, every L adjacent light-emitting devices in a same column of light-emitting devices are set as a light-emitting unit, the light-emitting devices in a same row are set to be of a same type, the light-emitting devices in at least one row of every L adjacent rows of light-emitting devices are electrically coupled to each other, and L is a natural number.

In some embodiments, L=3, the first electrode of one light-emitting device located in each light-emitting unit is set to be in the first group of first electrodes, and the first electrodes of the other two light-emitting devices in the light-emitting unit are set to be in the second group of first electrodes.

In some embodiments, L=3, the first electrode of one light-emitting device in each light-emitting unit is set to be in the second group of first electrodes, and the first electrodes of the other two light-emitting devices in the light-emitting unit are set to be in the first group of first electrodes.

In some embodiments, L=3, the first electrode of one light-emitting device in each light-emitting unit is set to be in the first group of first electrodes, and the first electrode of another light-emitting device in the light-emitting unit is set to be in the second group of first electrodes.

In some embodiments, each light-emitting unit includes three types of light-emitting devices: an organic light-emitting diode (OLED) emitting red light, an OLED emitting green light and an OLED emitting blue light.

In some embodiments, the light-emitting devices in the light-emitting unit are OLEDs emitting white light, each OLED emitting white light being provided, at a light-outgoing side thereof, with one color filter selected from a red color filter, a green color filter and a blue color filter. The OLEDs emitting white light which are provided with the same color filters at the light-outgoing sides thereof are of a same type, and each light-emitting unit includes three types of light-emitting devices.

In some embodiments, the first electrodes of the plurality of light-emitting devices are separate anodes, and the second electrodes of the plurality of light-emitting devices are interconnected planar cathodes.

The present disclosure further provides a method for driving the lighting panel, including steps of providing the at least one touch driving signal to the at least one touch scan line during the touch period; acquiring the at least one touch sensing signal from the at least one touch sensing line during the touch period; analyzing the acquired at least one touch sensing signal to obtain an analysis result; and controlling lighting parameters of the lighting panel during the lighting period according to the analysis result.

In some embodiments, the steps of analyzing the acquired at least one touch sensing signal to obtain an analysis result and controlling lighting parameters of the lighting panel during the lighting period according to the analysis result include detecting at least one touch position and a touch action according to the acquired at least one touch sensing signal, determining a touch behavior according to the detected at least one touch position and touch action, and adjusting the at least one first and second lighting signals according to the determined touch behavior during the lighting period, so as to control at least one of brightness and color temperature of the lighting panel.

In some embodiments, the steps of detecting at least one touch position and a touch action according to the acquired at least one touch sensing signal, determining a touch behavior according to the detected at least one touch position and touch action, and adjusting the at least one first second lighting signals according to the determined touch behavior during the lighting period so as to control at least one of brightness and color temperature of the lighting panel include steps of forming a touch path according to the at least one touch position and a start and an end points of the touch action, determining a spatial position relationship between the obtained touch path and a preset brightness and color temperature touch directions, and determining the touch behavior according to the determined spatial position relationship; and adjusting the first and second lighting signals during the lighting period according to the touch behavior and a preset corresponding relationship between at least one touch behavior and the first and second lighting signals, so as to change at least one of the brightness and color temperature of the lighting panel which are determined by the at least one first and second lighting signals.

In some embodiments, the brightness touch direction and the color temperature touch direction are set in a plane parallel to the lighting panel, and are set perpendicular to each other; and the brightness touch direction and the color temperature touch direction are set to be parallel to an extending direction of the at least one touch scan line and an extending direction of the at least one touch sensing line, respectively.

In some embodiments, the brightness touch direction is set in a plane parallel to the lighting panel, and the color temperature touch direction is set in a plane perpendicular to the lighting panel, and is perpendicular to the brightness touch direction.

In some embodiments, a driving period comprises a touch period and a lighting period, and a duration of the lighting period is 2 to 4 times a duration of the touch period.

The present disclosure further provides a lighting lamp, including the lighting panel above and a lamp holder for supporting the lighting panel.

BRIEF DESCRIPTION OF THE FIGURES

FIG. 4 is a flowchart of a process of fabricating a light-emitting device according to embodiments of the present disclosure;

DETAILED DESCRIPTION

In order to enable those skilled in the art to better understand the technical solutions of the present disclosure, the lighting panel, the driving method of the same, and the lighting lamp of the present disclosure will be further described in detail below with reference to the accompanying drawings and embodiments.

Organic light-emitting diodes (OLEDs) have the advantages of self-luminescence, low power consumption and extremely high response speed, and thus have been widely used in display field. The present disclosure applies the OLEDs, which have been widely used in display field, in lighting field, so as to obtain a flat light source having uniform light emission and soft light, thereby achieving eye protection.

The present disclosure provides a smart lighting panel, which adopts a more user-friendly and convenient method for adjusting brightness and color temperature, in which electrodes of OLEDs are used in time-division multiplexing way to receive a plurality of different lighting signals during a lighting period and receive a touch driving signal and transmit touch sensing signals during a touch period, so as to realize adjustment of brightness and color temperature.

The embodiment provides a smart lighting panel having adjustable brightness and color temperature, which is based on OLEDs and is integrated with a capacitive touch mode, and may achieve better lighting effects.

Figure 1:
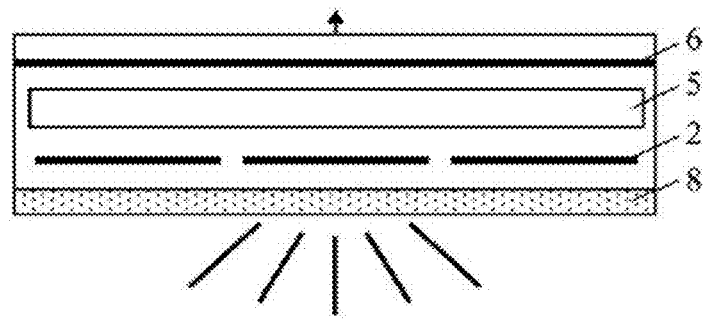
FIG. 1 is a cross-sectional diagram of a structure of a lighting panel according to embodiments of the present disclosure.
Figure 2A:
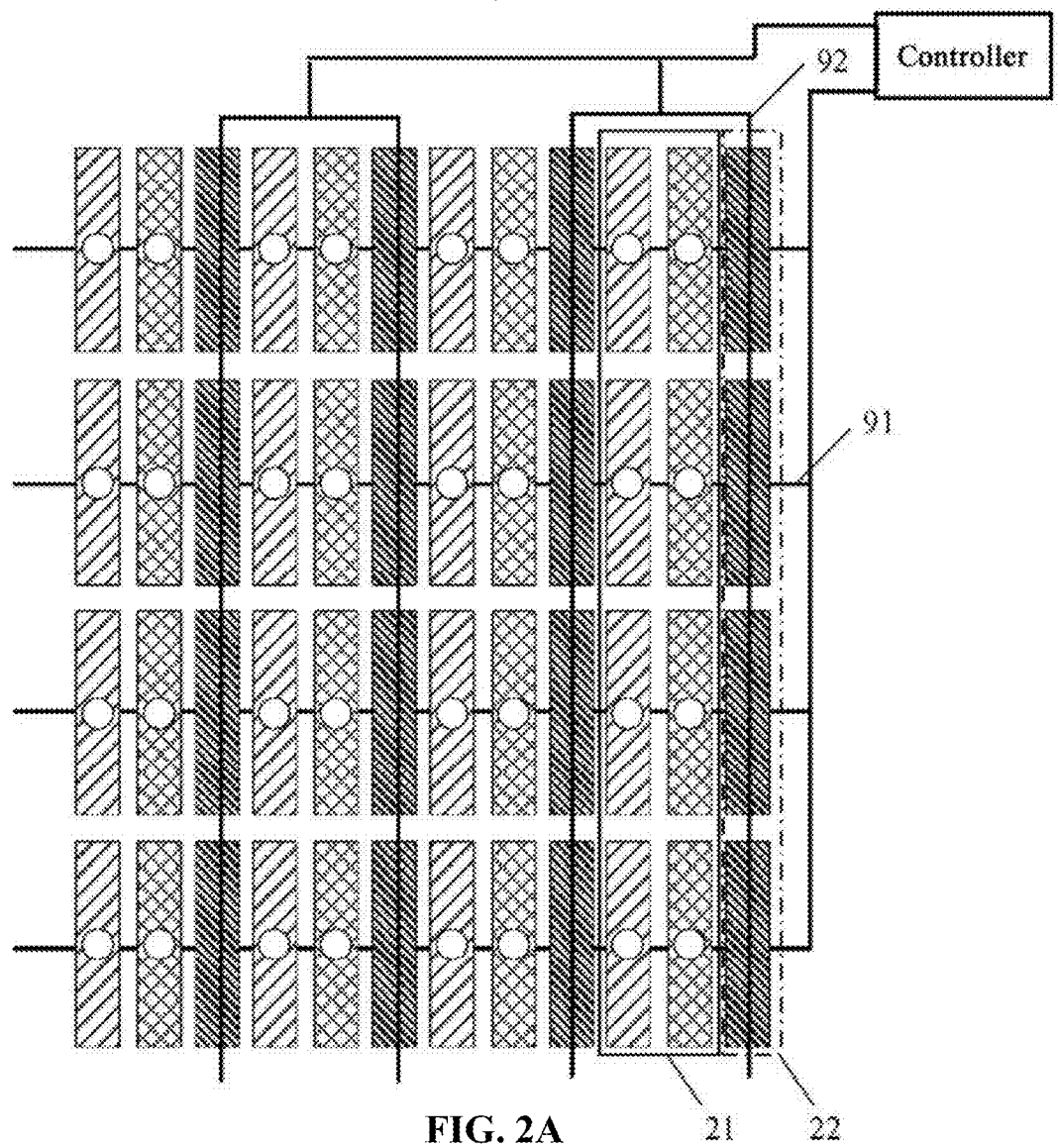
FIGS. 2A and 2B are plan views of a structure of a lighting panel according to embodiments of the present disclosure.
Figure 2B:
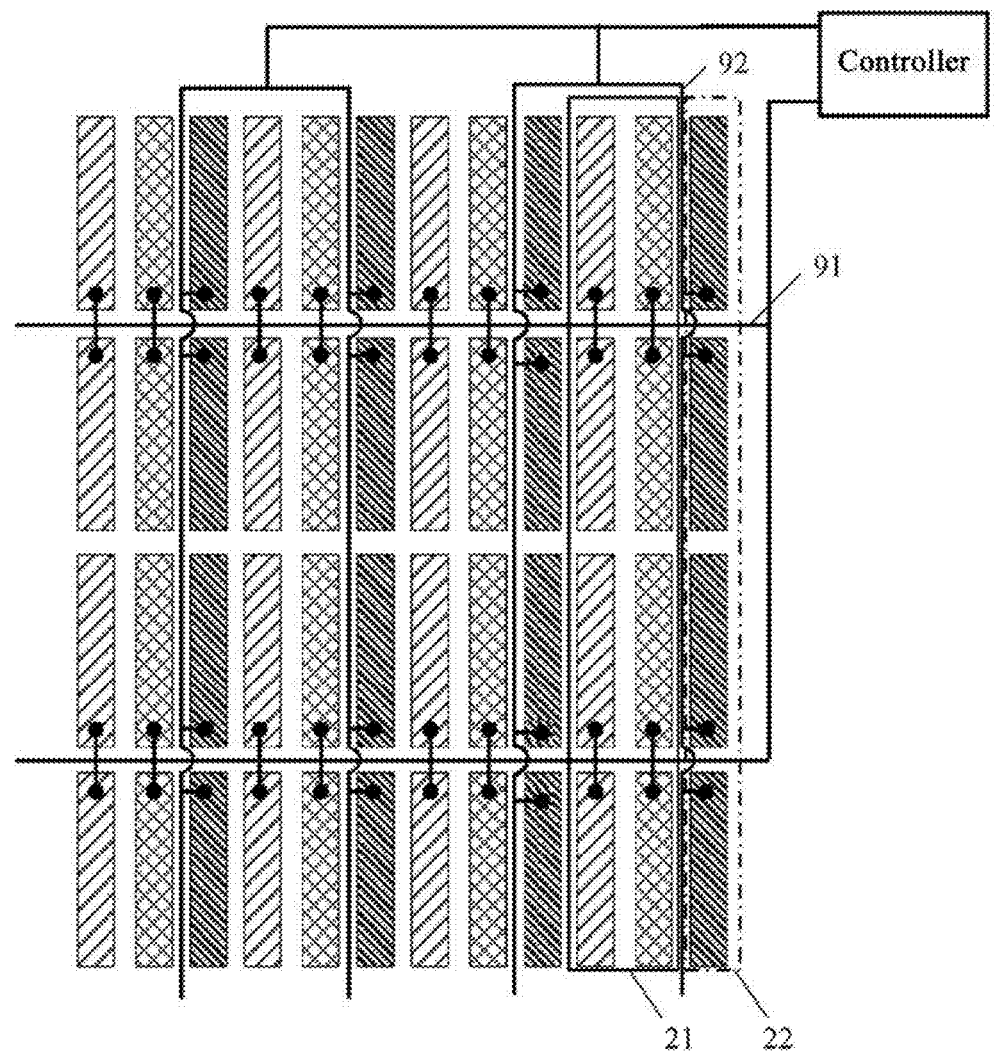

As shown in FIG. 1, a light-emitting device includes a first electrode 2, a second electrode 6, and a light-emitting layer 5 disposed therebetween. As shown in FIGS. 2A and 2B, the lighting panel includes a plurality of light-emitting devices (i.e., a plurality of pixels) arranged in rows and columns along a first direction and a second direction which intersect with each other. Each light-emitting device in the lighting panel is an OLED including a first electrode 2 close to a light-outgoing surface and a second electrode 6 away from the light-outgoing surface. As shown in FIG. 1, the first electrode 2 of each light-emitting device is discrete, while the second electrodes 6 of all the light-emitting devices are included in one piece. As shown in FIGS. 2A and 2B, the first electrodes 2 of at least a part of the plurality of light-emitting devices in the lighting panel are divided into a first group of first electrodes 21 and a second group of first electrodes 22, which are arranged in rows and columns along the first direction and the second direction respectively. As shown in FIGS. 2A and 2B, the lighting panel further includes a controller, at least one touch scan line 91 extending along the first direction and at least one touch sensing line 92 extending along the second direction. The at least one touch scan line 91 is electrically coupled to the first group of first electrodes 21 which are configured to receive at least one first lighting signal during a lighting period and receive at least one touch driving signal during a touch period, and the at least one touch sensing line 92 is electrically coupled to the second group of first electrodes 22 which are configured to receive at least one second lighting signal during the lighting period and each first electrode 22 transmits a touch sensing signal during the touch period.

The controller is configured to control lighting parameters of the lighting panel according to the touch sensing signals. Specifically, the controller is configured to provide the touch driving signal to the at least one touch scan line 91 during the touch period, acquire the touch sensing signals from the at least one touch sensing line 92 during the touch period, detect a touch position and a touch action according to the acquired touch sensing signals, determine a touch behavior according to the detected touch position and touch action, and adjust the first and second lighting signals according to the determined touch behavior during the lighting period, so as to control brightness and color temperature of the lighting panel. The controller may be a processor (for example, a CPU or an MCU), an integrated circuit, or any proper device capable of implementing the above functions.

In the lighting panel, the at least one touch scan line 91 and the at least one touch sensing line 92 are arranged to vertically intersect with each other, and are disposed in different layers.

In some embodiments, as shown in FIGS. 2A and 2B, the lighting panel includes a plurality of touch scan lines 91, which are arranged parallel with each other and electrically coupled to at least one column of the first group of first electrodes 21. The lighting panel includes a plurality of touch sensing lines 92, which are arranged parallel with each other and electrically coupled to at least one row of the second group of first electrodes 22. Therefore, there are a plurality of intersections between the plurality of touch scan lines 91 and the plurality of touch sensing lines 92, so as to realize the capacitive touch mode. Alternatively, in some embodiments, the plurality of touch scan lines 91 are electrically coupled to at least one row of the first group of first electrodes 21, and the plurality of touch sensing lines 92 are electrically coupled to at least one column of the second group of first electrodes 22.

In some embodiments, every L adjacent light-emitting devices in a same row of light-emitting devices are set as a light-emitting unit, the light-emitting devices in a same column are set to be of the same type, and the first electrodes of at least one column of every L adjacent columns of light-emitting devices are electrically coupled to each other, in which L is a natural number. Alternatively, in some embodiments, every L adjacent light-emitting devices in the same column of light-emitting devices are set as a light-emitting unit, the light-emitting devices in the same row are set to be of the same type, and the first electrodes of at least one row of every L adjacent rows of light-emitting devices are electrically coupled to each other, in which L is a natural number. According to the lighting mode of the OLEDs, L=3 in some embodiments. Alternatively, L=4 in some embodiments.

In some embodiments, a light-emitting device in a light-emitting unit may be an OLED emitting red light, an OLED emitting green light or an OLED emitting blue light. In this case, light-emitting devices of the same type means OLEDS emitting the same color of light, and each light-emitting unit includes three types of light-emitting devices. That is, each light-emitting unit includes an OLED emitting red light, an OLED emitting green light and an OLED emitting blue light.

In some embodiments, the light-emitting devices in a light-emitting unit are OLEDs emitting white light, each OLED emitting white light is provided, at a light-outgoing side thereof, with one color filter selected from a red color filter, a green color filter and a blue color filter. In this case, light-emitting devices of the same type means OLEDs emitting white light which are provided with the filters of the same color at the light-outgoing sides thereof, and each light-emitting unit includes three types of light-emitting devices. That is, each light-emitting unit includes an OLED emitting white light which is provided with a red color filter, an OLED emitting white light which is provided with a green color filter, and an OLED emitting white light which is provided with a blue color filter.

By setting the first electrodes of m (m is an integral number which is equal to or larger than 1 but smaller than L) types of light-emitting devices in a light-emitting unit as being in the first group of first electrodes 21, and setting the first electrodes of the other light-emitting devices in the light-emitting unit as being in the second group of first electrodes 22, adjustment of color temperature may be achieved, and brightness of the same type of light-emitting devices is substantially the same. By means of time-division multiplexing of the first electrodes, the lighting panel may perform lighting by use of the first electrodes, and touch control of the lighting panel may also be performed by use of the first electrodes.

In some embodiments, as shown in FIGS. 2A and 2B, L=3, the first electrode of one light-emitting device located in the same position in each light-emitting unit is set as being in the second group of first electrodes 22, and the first electrodes of the other two light-emitting devices in each light-emitting unit are set as being the first group of first electrodes 21. The first group of first electrodes 21 are electrically coupled to the at least one touch scan line 91, and the second group of first electrodes 22 are electrically coupled to the at least one touch sensing line 92.

In some embodiments, the first electrode of one light-emitting device located in the same position in each light-emitting unit is set as being in the first group of first electrodes 21, and the first electrodes of the other two light-emitting devices in each light-emitting unit are set as being in the second group of first electrodes 22. The first group of first electrodes 21 are electrically coupled to the at least one touch scan line 91, and the second group of first electrodes 22 are electrically coupled to the at least one touch sensing line 92.

In the lighting panel, as shown in FIGS. 2A and 2B, the first electrodes 2 of the plurality of light-emitting devices are separate anodes, and the second electrodes 6 of the plurality of light-emitting devices are interconnected planar cathodes. That is, the anodes are designed to be separate from each other, and adjustment of brightness and color temperature may be realized by designing the anodes in such a separate way and connecting the anodes in different groups, so as to achieve better lighting effect.

Connections between the at least one touch scan line 91 and the at least one touch sensing line 92, and the first group of first electrodes 21 and the second group of first electrodes 22 may be different from those in the above embodiments.

In some embodiments, the at least one touch scan line 91 and the at least one touch sensing line 92 may be coupled to the first electrodes 2 through vias, for example, in FIG. 2A, the at least one touch scan line 91 is coupled to the first group of first electrodes 21 through vias. In some embodiments, the at least one touch scan line 91 and the at least one touch sensing line 92 may be coupled to the first electrodes 2 by disposing lines on the light-emitting devices, for example, in FIG. 2A, the at least one touch sensing line 92 is coupled to the second group of first electrodes 22 by disposing lines on the light-emitting devices. In some embodiments, the at least one touch scan line 91 and the touch sensing line 92 may be coupled to the first electrodes 2 by disposing lines between adjacent pixels, for example, in FIG. 2B, connection between the at least one touch scan line 91 and the first group of first electrodes 21, and connection between the at least one touch sensing line 92 and the second group of first electrodes 22 are both realized by disposing lines between adjacent pixels. Moreover, the at least one touch scan line 91 and the at least one touch sensing line 92 may be coupled to the first electrodes 2 by any other proper means.

Figure 3:
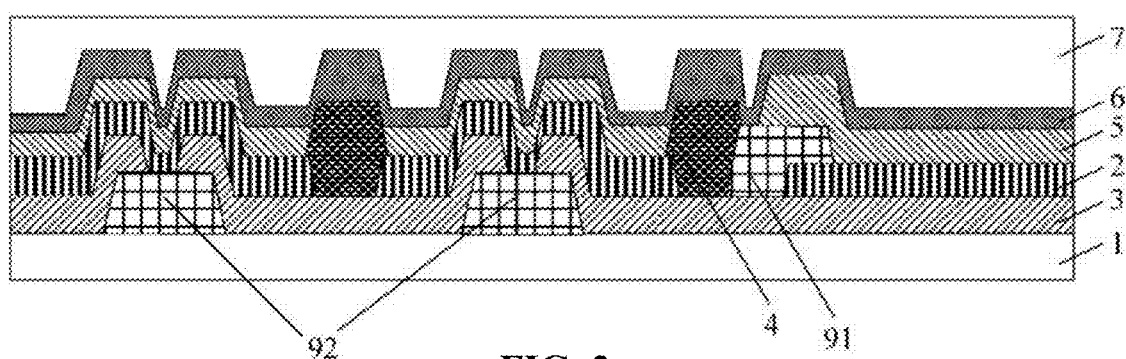
FIG. 3 is a cross-sectional diagram of a structure of a light-emitting device according to embodiments of the present disclosure.

Since an electrode dividing process of time-division multiplexing is involved, in the embodiments of the present disclosure, the OLEDs serving as the light-emitting devices are all bottom-emitting OLEDs, so that electrode dividing may be realized by use of the existing technology. As for a concrete structure of a bottom-emitting OLED, please refer to FIG. 3 which is a sectional view of a bottom-emitting OLED. As shown in FIG. 3, a bottom-emitting OLED includes a substrate 1, a touch sensing line 92, a passivation layer 3, a first electrode 2, a touch scan line 91, a light-emitting layer 5, a second electrode 6 and a protection layer 7, which are stacked sequentially from bottom to top. Moreover, a pixel definition layer 4 is provided in the bottom-emitting OLED. As shown in FIG. 3, the touch scan line 91 and the touch sensing line 92 are disposed in different layers.

FIG. 4 is a flowchart of a process of fabricating an OLED according to the embodiments of the present disclosure. The process of fabricating the OLED includes the following steps.

A metal material (such as Al or Cu) is deposited on the substrate 1, and then is form as a pattern including one of the touch scan line 91 and the touch sensing line 92 by a patterning process.

A pattern including the passivation layer 3 is formed on the one of the touch scan line 91 and the touch sensing line 92 by a patterning process.

A conductive material (such as Indium Tin Oxide (ITO)) is deposited on the passivation layer 3, and then is form as a pattern including the first electrode 2 (i.e., anode) by a patterning process.

A metal material (such as Al or Cu) is deposited on the first electrode 2, and then is form as a pattern including the other one of the touch scan line 91 and the touch sensing line 92 by a patterning process.

A pattern including the pixel definition layer 4 is formed on the other one of the touch scan line 91 and the touch sensing line 92 by a patterning process.

A luminescent material is deposited, and then is form as a pattern including the light-emitting layer 5 by a patterning process.

A metal material is deposited, and then is form as a pattern including the second electrode 6 (i.e., cathode) by a patterning process.

Finally, a packaging process is performed so as to form the OLED including the protection layer 7.

Herein, the deposition process includes an evaporation process. The patterning processing includes a photolithography process, and other processes for forming predetermined patterns, such as printing and inkjet. The photolithography process is a pattern forming process which includes steps of exposure, development and etching and involves use of photoresist, masks and exposure machines.

In some embodiments, the lighting panel is further provided, at the light-outgoing side thereof, with a light extraction film 8 capable of effectively enhancing lighting brightness and uniformity. For example, the light extraction film 8 is disposed by means of attachment.

Figure 5:
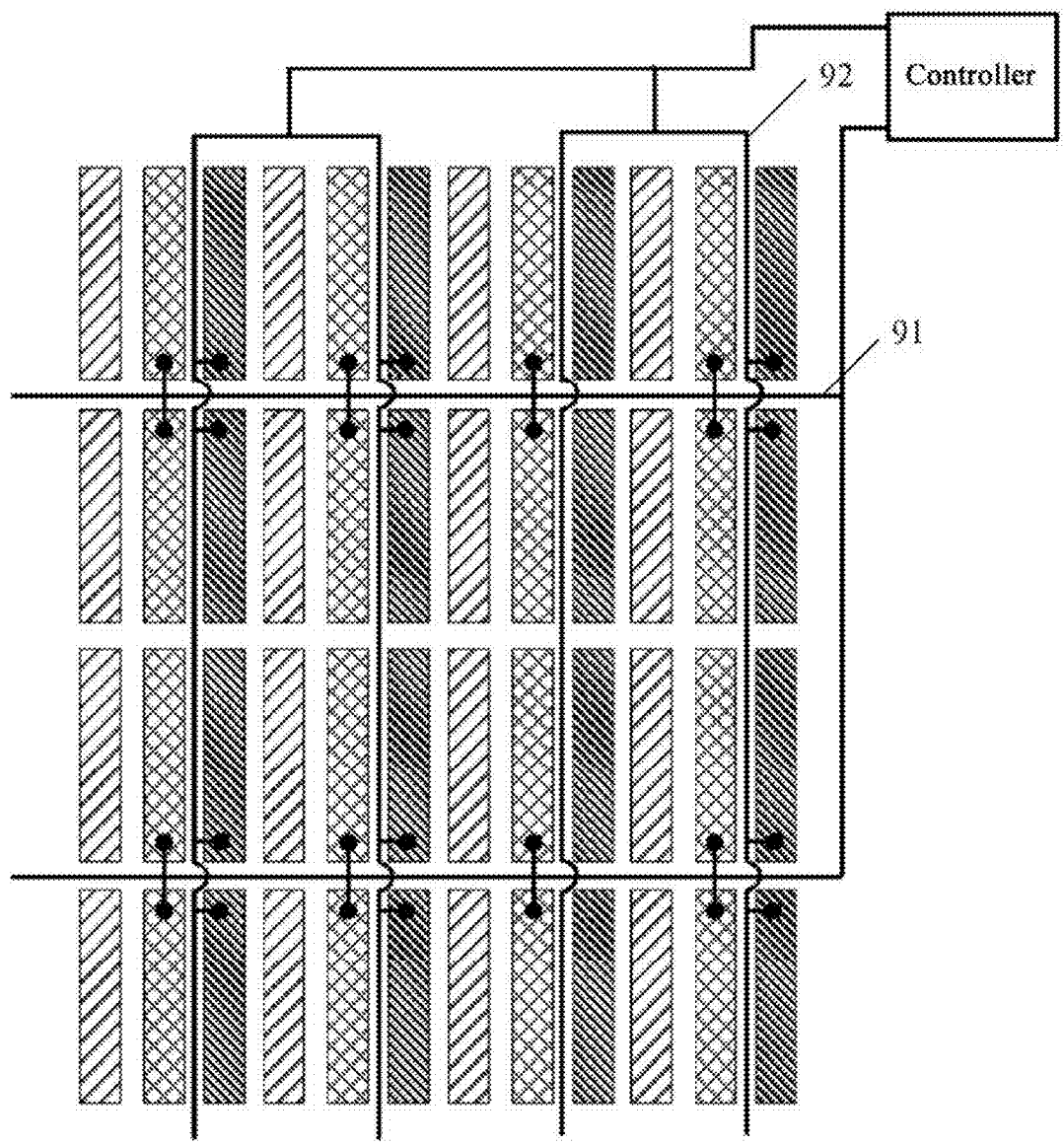
FIG. 5 is a plan view of a structure of a lighting panel according to embodiments of the present disclosure.

Configuration of the first group of first electrodes 21 and the second group of first electrodes 22 may be different from that of the above embodiments. For example, as shown in FIG. 5, the first electrode of one light-emitting device located in the same position in each light-emitting unit is set as the first group of first electrodes 21, and the first electrode of one light-emitting device located in another same position in each light-emitting unit is set as the second group of first electrodes 22. In such case, the at least one touch scan line 91 is electrically coupled to the first group of first electrodes 21, and the at least one touch sensing line 92 is electrically coupled to the second group of first electrodes 22. The first electrodes, which are not coupled to the at least one touch scan line 91 or the at least one touch sensing line 92, are coupled to lines (not shown) that provide a third lighting signal.

The embodiments of the present disclosure provide a method adapted to drive the lighting panel of the above embodiments.

Figure 6:
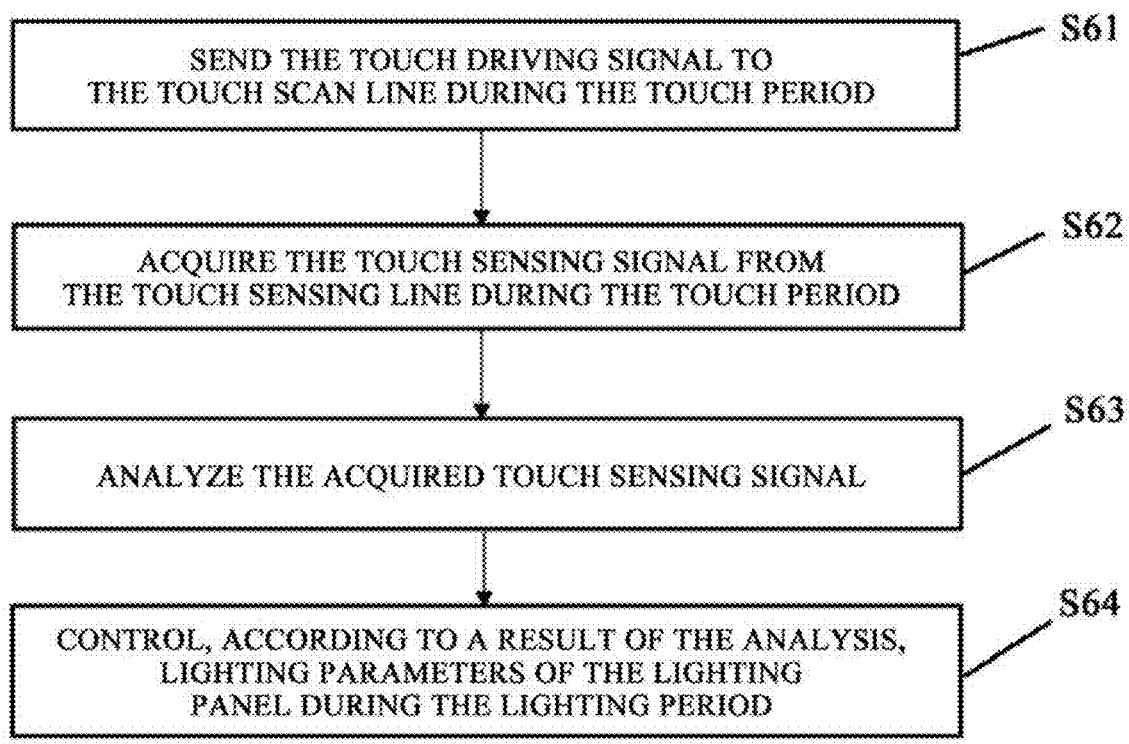
FIG. 6 is a schematic diagram of a method for driving a lighting panel according to embodiments of the present disclosure.

As shown in FIG. 6, the method includes the following steps S61-S64.

In S61, the touch driving signal is sent to the at least one touch scan line 91 during the touch period.

In S62, the touch sensing signals are acquired from the at least one touch sensing line 92 during the touch period.

In S63, the acquired touch sensing signals are analyzed.

In S64, lighting parameters of the lighting panel are controlled according to a result of the analysis result during the lighting period.

By using the first electrodes 2 in time-division multiplexing way, the method allows adjustment of brightness and color temperature by touch control. In brightness adjustment, a change ratio of the first lighting signal is the same as that of the second lighting signal. While in color temperature adjustment, the change ratio of the first lighting signal is different from that of the second lighting signal.

The steps S63 and S64 specifically include detecting a touch position and a touch action according to the acquired touch sensing signals, determining a touch behavior according to the detected touch position and touch action, and adjusting the first and second lighting signals according to the determined touch behavior during the lighting period, so as to control brightness and color temperature of the lighting panel. The touch sensing signals may be acquired by means of progressive scanning.

Detecting a touch position and a touch action according to the acquired touch sensing signals, determining a touch behavior according to the detected touch position and touch action, and adjusting the first and second lighting signals according to the determined touch behavior during the lighting period so as to control brightness and color temperature of the lighting panel, include forming a touch path according to the touch position and a start point and an end point of the touch action, determining a spatial position relationship between the obtained touch path and preset brightness touch direction and color temperature touch direction, and determining a touch behavior according to the determined spatial position relationship; and adjusting the first and second lighting signals during the lighting period according to the touch behavior and preset corresponding relationship between each touch behavior and the first and second lighting signals, so as to change the brightness and color temperature of the lighting panel which are determined by the first and second lighting signals.

In other words, by analyzing the touch behavior and adjusting the first and second lighting signals applied to the first electrodes 2 according to the analysis result, the brightness and color temperature of the lighting panel are adjusted by touch control. In some embodiments, the brightness touch direction and color temperature touch direction are set in a plane parallel to the lighting panel, and are set perpendicular to each other; and the brightness touch direction and color temperature touch direction are set to be parallel to an extending direction of the at least one touch scan line 91 and an extending direction of the at least one touch sensing line 92, respectively. In some embodiments, the brightness touch direction is set in a plane parallel to the lighting panel, and the color temperature touch direction is set in a plane perpendicular to the lighting panel, and is perpendicular to the brightness touch direction.

The brightness touch direction and color temperature touch direction may be set in a way different from the above embodiments according to actual conditions. The touch control will work no matter a finger actually touches the lighting panel or not, as long as the touch behavior is performed within a sensing range of the lighting panel. No limitation of a specific position where the touch behavior is performed is made.

In the method for driving the lighting panel, the light-emitting devices are driven by pulses. In a driving period (or a set time) including the touch period and the lighting period, time during which the first electrodes 2 are used for lighting may be 2 to 4 times as long as time during which the first electrodes 2 are used for touch control.

In some embodiments, when no touch action is detected, the lighting signal is provided to the first electrodes 2 coupled to the at least one touch scan line 91 and the at least one touch sensing line 92; when a touch action is detected, the touch driving signal is provided to the first electrodes 2 coupled to the at least one touch scan line 91, the touch sensing signals including information about change of quantity of electric charges of the first electrodes 2 is acquired from the first electrodes 2 coupled to the at least one touch sensing line 92, and the touch position and touch action are determined by analyzing the change of quantity of electric charges of the first electrodes 2.

Figure 7:
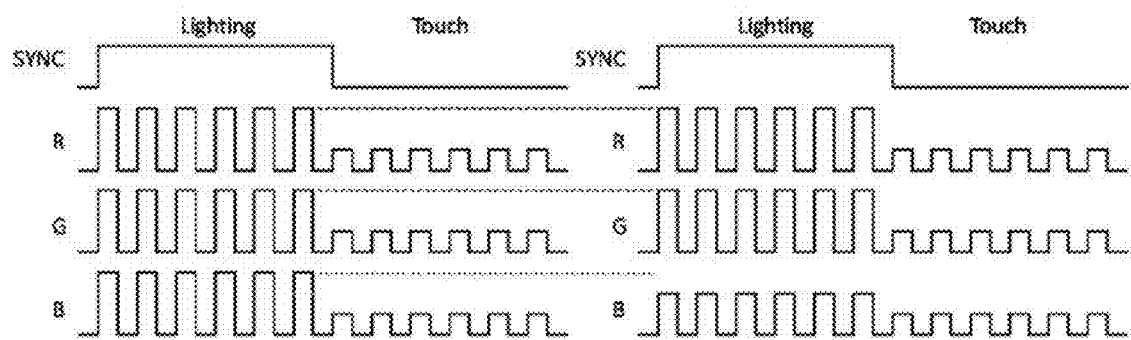
FIG. 7 is a timing diagram of a method for driving a lighting panel according to embodiments of the present disclosure.

FIG. 7 is a timing diagram of the method for driving the lighting panel. By comparing the timing diagram on left side and the timing diagram on right side, it can be seen that strength of a pulse B used for driving the light-emitting device emitting blue light during the lighting period is weakened while strength of pulses used for driving other types of the light-emitting devices are not changed in the timing diagram on right side, so that blue light emitted from the lighting panel becomes weak, and thus color temperature of the lighting panel changes. When different touch behaviors are detected, different lighting signals are provided to different groups of first electrodes serving as anodes, so as to obtain different color temperatures.

With the method for driving the lighting panel, adjustment of color temperature and brightness may be achieved, so as to better adapt to different use environments and enable customers to experience better lighting effects.

The embodiments of the present disclosure provide a lighting lamp, comprising the lighting panel of the above embodiments and a lamp holder for supporting the lighting panel.

Figure 8A:
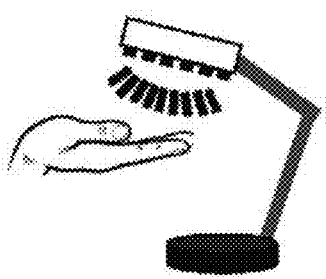
FIGS. 8A and 8B are schematic diagrams of how to use a lighting lamp according to embodiments of the present disclosure.
Figure 8B:
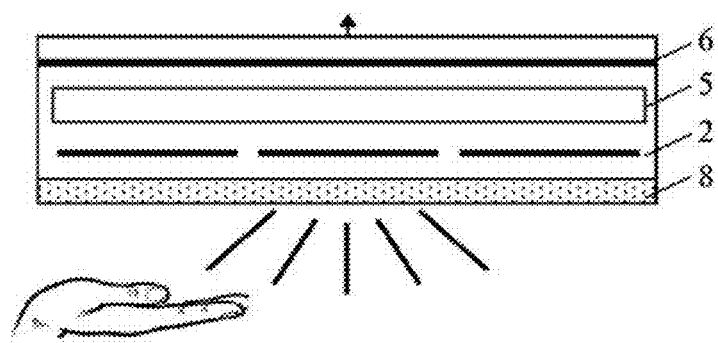

As shown in FIGS. 8A and 8B, users may control the lighting lamp and the lighting panel of the embodiments of the present disclosure by hands.

FIGS. 9A to 9F are schematic diagrams of of how to control lighting parameters of a lighting lamp according to embodiments of the present disclosure. Different touch behaviors lead to different lighting statuses of the lighting panel. For example, brightness changes by sliding a hand left and right, and color temperature changes by sliding a hand back and forth.

Figure 9A:
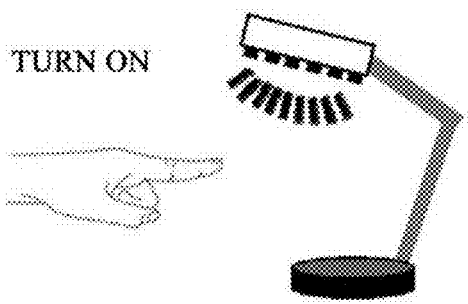
FIGS. 9A to 9F are schematic diagrams of how to control lighting parameters of a lighting lamp according to embodiments of the present disclosure.
Figure 9B:
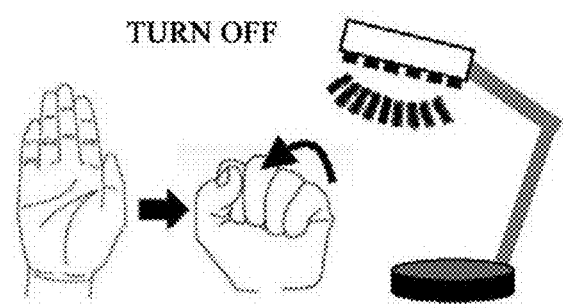
Figure 9C:
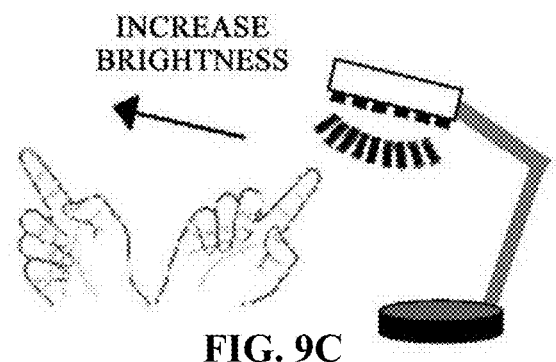
Figure 9D:
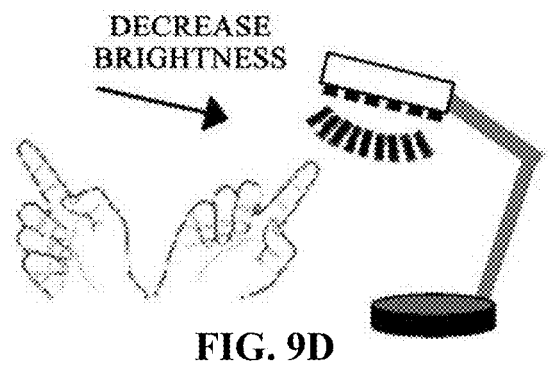
Figure 9E:
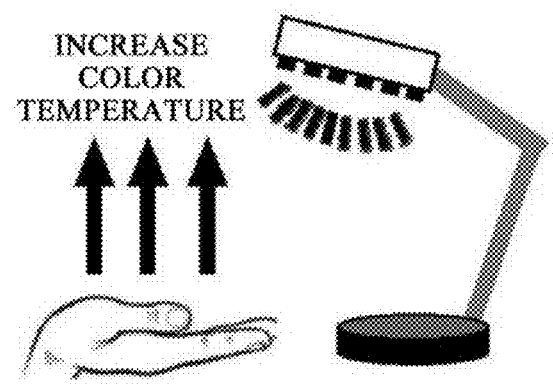
Figure 9F:
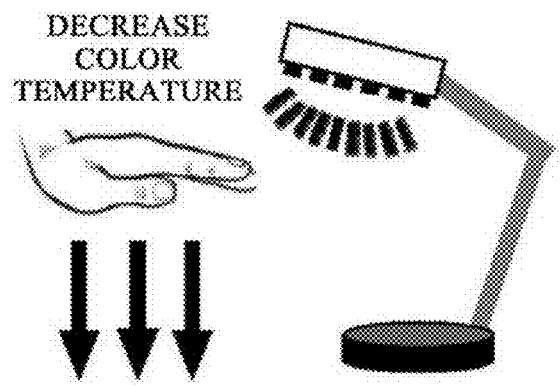

As shown in FIGS. 9A and 9B, in some embodiments, the lighting lamp may be controlled to be powered on and the lighting panel starts emitting light by moving a finger close to the lighting lamp, and the lighting lamp may be controlled to be powered off and the lighting panel stops emitting light by making a fist. As shown in FIGS. 9C and 9D, in some embodiments, brightness of the lighting panel may be controlled to increase or decrease by sliding a finger along the extending direction of the at least one touch sensing line 92 in a plane parallel to the plane of the lighting panel. In some embodiments, brightness of the lighting panel may be controlled to increase or decrease by sliding a finger along the extending direction of the at least one touch scan line 91. As shown in FIGS. 9E and 9F, in some embodiments, color temperature of the lighting panel may be controlled to rise or drop by moving a hand upwards or downwards in a plane perpendicular to the lighting panel. Capacitance is changed by differing a distance between a hand and the lighting panel, and different capacitances lead to different brightness or color temperatures. Moreover, the lighting statuses of the lighting panel may be controlled by any other proper means.

Brightness and color temperature of light emitted from the lighting lamp of the present disclosure may be conveniently adjusted to provide better lighting effects for users, so as to facilitate eye protection of children and teenagers.

It should be understood that the foregoing implementations are merely exemplary implementations adopted for describing the principle of the present disclosure, but the present disclosure is not limited thereto. Ordinary skilled persons in the art may make various variations and improvements without departing from the spirit and essence of the present disclosure, and these variations and improvements shall be considered to fall into the protection scope of the present disclosure.

What is claimed is:

1. A lighting panel, comprising:
 a plurality of light-emitting devices, each of which comprises a first electrode, a second electrode, and a light-emitting layer disposed therebetween, the first electrodes of at least a part of the plurality of light-emitting devices being divided into a first group of first electrodes and a second group of first electrodes, the plurality of light-emitting devices being arranged in rows and columns along a first direction and a second direction which intersect with each other;
 at least one touch scan line extending along the first direction and at least one touch sensing line extending along the second direction, the at least one touch scan line being electrically coupled to the first group of first electrodes which are configured to receive at least one first lighting signal during a lighting period and receive at least one touch driving signal during a touch period, respectively, and the at least one touch sensing line being electrically coupled to the second group of first electrodes which are configured to receive at least one second lighting signal during the lighting period and transmit at least one touch sensing signal during the touch period, respectively; and a controller configured to control lighting parameters of the lighting panel according to the at least one touch sensing signal.

2. The lighting panel of claim 1, wherein the controller is configured to provide the at least one touch driving signal to the at least one touch scan line during the touch period, acquire the at least one touch sensing signal from the at least one touch sensing line during the touch period, detect at least one touch position and a touch action according to the acquired at least one touch sensing signal, determine a touch behavior according to the detected at least one touch position and touch action, and adjust the at least one first and second lighting signals according to the determined touch behavior during the lighting period, so as to control at least one of brightness and color temperature of the lighting panel.

3. The lighting panel of claim 1, wherein, the at least one touch scan line and the at least one touch sensing line are arranged to vertically intersect with each other, and are disposed in different layers.

4. The lighting panel of claim 1, wherein, the lighting panel comprises,
a plurality of touch scan lines, which are arranged parallel with each other and each of the plurality of touch scan lines is electrically coupled to at least one column of the first group of first electrodes; and
a plurality of touch sensing lines, which are arranged parallel with each other and each of the plurality of touch sensing lines is electrically coupled to at least one row of the second group of first electrodes.

5. The lighting panel of claim 1, wherein, the lighting panel comprises,
a plurality of touch scan lines, which are arranged parallel with each other and each of the plurality of touch scan lines is electrically coupled to at least one row of the first group of first electrodes; and
a plurality of touch sensing lines, which are arranged parallel with each other and each of the plurality of touch sensing lines is electrically coupled to at least one column of the second group of first electrodes.

6. The lighting panel of claim 1, wherein, every L adjacent light-emitting devices in a same row of light-emitting devices are set as a light-emitting unit, the light-emitting devices in a same column are set to be of a same type, the light-emitting devices in at least one column of every L adjacent columns of light-emitting devices are electrically coupled to each other, and L is a natural number.

7. The lighting panel of claim 6, wherein, L=3, the first electrode of one light-emitting device in each light-emitting unit is set to be in the first group of first electrodes, and the first electrodes of the other two light-emitting devices in the light-emitting unit are set to be in the second group of first electrodes.

8. The lighting panel of claim 6, wherein, L=3, the first electrode of one light-emitting device in each light-emitting unit is set to be in the second group of first electrodes, and the first electrodes of the other two light-emitting devices in the light-emitting unit are set to be in the first group of first electrodes.

9. The lighting panel of claim 6, wherein, L=3, the first electrode of one light-emitting device in each light-emitting unit is set to be in the first group of first electrodes, and the first electrode of another light-emitting device in the light-emitting unit is set to be in the second group of first electrodes.

10. The lighting panel of claim 6, wherein, each light-emitting unit comprises three types of light-emitting devices: an organic light-emitting diode (OLED) emitting red light, an OLED emitting green light and an OLED emitting blue light.

11. The lighting panel of claim 6, wherein, the light-emitting devices in the light-emitting unit are OLEDs emitting white light, each OLED emitting white light being provided, at a light-outgoing side thereof, with one color filter selected from a red color filter, a green color filter and a blue color filter, the OLEDs emitting white light which are provided with the same color filters at the light-outgoing sides thereof are of a same type, and each light-emitting unit comprises three types of light-emitting devices.

12. The lighting panel of claim 1, wherein, every L adjacent light-emitting devices in a same column of light-emitting devices are set as a light-emitting unit, the light-emitting devices in a same row are set to be of a same type, the light-emitting devices in at least one row of every L adjacent rows of light-emitting devices are electrically coupled to each other, and L is a natural number.

13. The lighting panel of claim 1, wherein, the first electrodes of the plurality of light-emitting devices are separate anodes, and the second electrodes of the plurality of light-emitting devices are interconnected planar cathodes.

14. A lighting lamp, comprising the lighting panel of claim 1 and a lamp holder for supporting the lighting panel.

15. A method for driving a lighting panel, wherein,
the lighting panel comprises:
a plurality of light-emitting devices, each of which comprises a first electrode, a second electrode, and a light-emitting layer disposed therebetween, the first electrodes of at least a part of the plurality of light-emitting devices being divided into a first group of first electrodes and a second group of first electrodes, the plurality of light-emitting devices being arranged in rows and columns along a first direction and a second direction which intersect with each other;
at least one touch scan line extending along the first direction and at least one touch sensing line extending along the second direction, the at least one touch scan line being electrically coupled to the first group of first electrodes which are configured to receive at least one first lighting signal during a lighting period and receive at least one touch driving signal during a touch period, respectively, and the at least one touch sensing line being electrically coupled to the second group of first electrodes which are configured to receive at least one second lighting signal during the lighting period and transmit at least one touch sensing signal during the touch period, respectively; and
a controller configured to control lighting parameters of the lighting panel according to the at least one touch sensing signal, and
the method comprises steps of:
providing the at least one touch driving signal to the at least one touch scan line during the touch period, respectively;

acquiring the at least one touch sensing signal from the at least one touch sensing line during the touch period, respectively;

analyzing the acquired at least one touch sensing signal to obtain an analysis result; and controlling lighting parameters of the lighting panel during the lighting period according to the analysis result.

16. The method for driving a lighting panel of claim 15, wherein, the steps of analyzing the acquired at least one touch sensing signal to obtain an analysis result and controlling lighting parameters of the lighting panel during the lighting period according to the analysis result comprise steps of:

detecting at least one touch position and a touch action according to the acquired at least one touch sensing signal, determining a touch behavior according to the detected at least one touch position and touch action, and adjusting the first and second lighting signals according to the determined touch behavior during the lighting period, so as to control at least one of brightness and color temperature of the lighting panel.

17. The driving method for a lighting panel of claim 16, wherein, the steps of detecting at least one touch position and a touch action according to the acquired at least one touch sensing signal, determining a touch behavior according to the detected at least one touch position and touch action, and adjusting the at least one first and second lighting signals according to the determined touch behavior during the lighting period so as to control at least one of brightness and color temperature of the lighting panel comprise steps of:

forming a touch path according to the at least one touch position and a start and an end points of the touch action, determining a spatial position relationship between the obtained touch path and a preset brightness and color temperature touch directions, and determining the touch behavior according to the determined spatial position relationship; and adjusting the at least one first and second lighting signals during the lighting period according to the touch behavior and a preset corresponding relationship between at least one touch behavior and the at least one first and second lighting signals, so as to change at least one of the brightness and color temperature of the lighting panel which are determined by the at least one first and second lighting signals.

18. The method for driving a lighting panel of claim 17, wherein, the brightness touch direction and the color temperature touch direction are set in a plane parallel to the lighting panel, and are set perpendicular to each other; and the brightness touch direction and the color temperature touch direction are set to be parallel to an extending direction of the at least one touch scan line and an extending direction of the at least one touch sensing line, respectively.

19. The method for driving a lighting panel of claim 17, wherein, the brightness touch direction is set in a plane parallel to the lighting panel, and the color temperature touch direction is set in a plane perpendicular to the lighting panel, and is perpendicular to the brightness touch direction.

20. The method for driving a lighting panel of claim 15, wherein, a driving period comprises a touch period and a lighting period, and a duration of the lighting period is 2 to 4 times a duration of the touch period.

* * * * *